US012362027B2

(12) United States Patent
Khwa et al.

(10) Patent No.: US 12,362,027 B2
(45) Date of Patent: *Jul. 15, 2025

(54) SHIFT REGISTER HAVING LOW POWER MODE

(71) Applicant: Taiwan Semiconductor Manufacturing Company, Ltd., Hsinchu (TW)

(72) Inventors: Win-San Khwa, Taipei (TW); Yi-Lun Lu, New Taipei (TW); Jui-Jen Wu, Hsinchu (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/635,005

(22) Filed: Apr. 15, 2024

(65) Prior Publication Data

US 2024/0257888 A1 Aug. 1, 2024

Related U.S. Application Data

(63) Continuation of application No. 17/842,790, filed on Jun. 17, 2022, now Pat. No. 11,990,194.

(51) Int. Cl.
*G11C 19/28* (2006.01)
*H03K 3/037* (2006.01)

(52) U.S. Cl.
CPC ............. *G11C 19/28* (2013.01); *H03K 3/037* (2013.01)

(58) Field of Classification Search
CPC ................. G11C 19/184; G11C 19/28
See application file for complete search history.

(56) References Cited

U.S. PATENT DOCUMENTS

| 9,291,674 B1 * | 3/2016 | Lu ..................... G01R 31/3177 |
| 9,312,834 B1 * | 4/2016 | Parnami ............. H03K 3/35625 |
| 11,990,194 B2 * | 5/2024 | Khwa ..................... G11C 19/28 |
| 2008/0260090 A1 * | 10/2008 | Tso ......................... G11C 19/00 377/81 |
| 2010/0214854 A1 * | 8/2010 | Moon ..................... G11C 19/28 365/189.14 |

* cited by examiner

*Primary Examiner* — Patrick O Neill
(74) *Attorney, Agent, or Firm* — JCIPRNET (57) ABSTRACT

The disclosure introduces a shift register is configured to enter a low power mode by disabling a portion of flip-flops (FFs) that handles upper bits of input data. The shift register includes first FF(s), second FF(s) and gating circuit. The first flip-flop (FF), includes input terminal coupled to first portion of input data. The second FF includes input terminal coupled to second portion of input data, an output terminal, a clock terminal coupled to a clock signal, a power terminal coupled to a supply power. The second portion of the input data is subsequent to the first portion of the input data. The gating circuit is coupled to the output terminal of the first FF, and configured to disable the second FF for storing the second portion of a subsequent input data according to output data currently being stored in the first FF.

20 Claims, 6 Drawing Sheets

SHIFT REGISTER HAVING LOW POWER MODE

CROSS-REFERENCE TO RELATED APPLICATION

This application is a continuation application of and claims the priority benefit of U.S. patent application Ser. No. 17/842,790, filed on Jun. 17, 2022, now allowed. The entirety of the above-mentioned patent application is hereby incorporated by reference herein and made a part of this specification.

BACKGROUND

In digital circuit, flip-flop (FF) is known to store one-bit of information. A shift register includes a cascade of flip-flops, which are used to hold binary data. That is, an 'N' bit shift register contains 'N' flip-flops. The shift register is capable of shifting bits either towards right hand side or towards left hand side. The shift register is often found in calculators, computers, and data-processing systems for performing computations. For example, in neural network applications, shift registers are commonly used to accumulate the product-sum results. The conventional practice is un-gated shift registers, for which all the bits are active regardless of the value stored. However, in a case where the number of bits of the product-sum result is less than the total number of bits of the shift register, the unused flip-flops in the shift register would still consume energy.

DETAILED DESCRIPTION

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations.

As described above, shift register is configured to hold data and used for computation. In a case where the width of data under the computation only requires flip-flops (FFs) corresponding to the lower bits in the shift register, the FFs corresponding to the upper bits are still active. The FFs corresponding to the unused upper bits still consume energy. The disclosure introduces a shift register that is capable of disabling the FFs corresponding to the unused upper bits according to the data being input to the shift register. That is, the shift register of the embodiments is configured to enter a low power mode by disabling a portion of the FFs that are not being used based on the input data that is currently stored in the FFs of the shift register. The output data of the FFs represents the input data that is currently being stored in the FFs, which is utilized to determine whether to disable the portion of the FFs for the subsequent cycle. Detail of the shift register would be described below in details.

Figure 1:
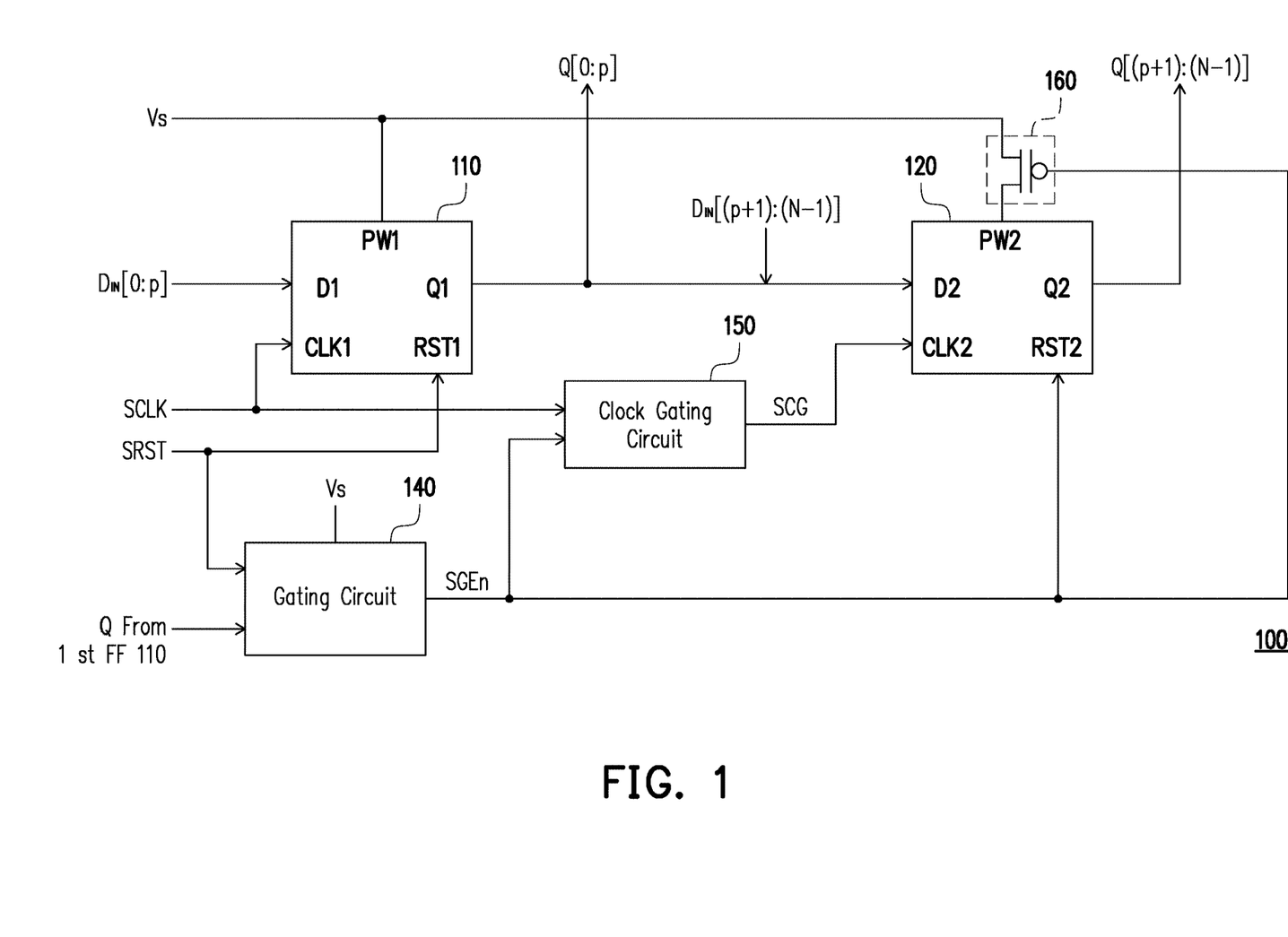
FIG. 1 is diagram illustrating a shift register according to some embodiments of the disclosure.

FIG. 1 is diagram illustrating a shift register 100 according to some embodiments of the disclosure. The shift register 100 includes a first FF 110, a second FF 120, a gating circuit 140, a clock gating circuit 150, and a power gating circuit 160. The first FF 110 and the second FF 120 are daisy chained together in series and respectively receive a first portion of input data Din and a second portion of the input data Din. In the embodiments, the shift register 100 may be N-bit wide shift register that is capable of holding N bits of binary data, where N is an integer greater than 1. The first portion of the input data Din may be bit 0 thru bit p, i.e., Din [0:p], which may also be referred to as lower bits of the input data. The second portion of the input data Din may be bit (p+1) thru bit (N−1), i.e., Din [(p+1):(N−1)], which may be referred to as upper bits of the input data, where the variable p is an integer greater than 0. For example, the variable p may be configured to be 12 in a 20-bit wide shift register. The first portion of the input data may be lower twelve bits of the input data Din, i.e., bit 0 thru bit 12, Din[0:11]. The second portion of the input data may be upper 8 bits of the input data Din, i.e., bit 12 through bit 19, Din[13:19]. The example of 20-bit shift register is used in the specification for the purpose of illustration only. However, the embodiments are not intended to limit the width of the shift register and the variable p. In some other embodiments, the width of the shift register (i.e., N) may be 2, 4, 8, 16, 20, 32, and so on. The variable p may be configured to be any bit position of N-bit shift registers based on the design requirements.

The first FF 110 includes an input terminal D1, a clock terminal CLK1, a reset terminal RST1, an output terminal Q1, and a power terminal PW1. The input terminal D1 is coupled to the first portion of the input data Din[0:p]. The clock terminal CLK1 is coupled to a clock signal SCLK. The reset terminal RST1 is coupled to a reset signal SRST. The power terminal PW1 is coupled to a supply voltage Vs. The output terminal Q1 is coupled to the second FF 120 and outputs an output data of the first FF (e.g., Q[0:p]). The first FF 110 is configured to transit between two stable states. The first FF 110 is configured to change state based on the received input data Din at the input terminal D1. The state of the first FF 110 is reset based on the reset signal RST received at the reset terminal RST1. The state transitions may be synchronous with the clock signal SCLK received at the clock terminal CLK1. However, the embodiments are not intended to limit the disclosure. In some other embodiments, the first FF 110 may be asynchronous. The state of the first FF 110 is represented by the output data at the output terminal Q1. In the embodiments, the output terminal Q1 includes a first output terminal (e.g., Q1) and a second output terminal (e.g., Q1') which outputs data that is complementary to output data at the first output terminal.

The second FF 120 includes an input terminal D2, a clock terminal CLK2, a reset terminal RST2, an output terminal Q2, and a power terminal PW2. The input terminal D2 is coupled to the second portion of the input data Din[(p+1):(N−1)]. The clock terminal CLK2 is coupled to the clock signal SCLK. The reset terminal RST2 is coupled to the reset signal SRST. The power terminal PW2 is coupled to the supply voltage Vs. The output terminal Q2 outputs an output data Q[(p+1):(N−1)]. The second FF 120 is configured to transit between two stable states. The second FF 120 is configured to change state based on the received input data Din at the input terminal D2. The state of the second FF 120 is reset based on the reset signal RST received at the reset terminal RST2. The state transitions may be synchronous with the signal received at the clock terminal CLK2. However, the embodiments are not intended to limit the disclosure. In some other embodiments, the second FF 120 may be asynchronous. The state of the second FF 120 is represented by the output data at the output terminal Q2. In the embodiments, the output terminal Q2 includes a first output terminal (e.g., Q2) and a second output terminal (e.g., Q2') which outputs data that is complementary to output data at the first output terminal.

The gating circuit 140 includes a first input terminal, a second input terminal, and an output terminal. The first input terminal receives the output data Q[p] from the first FF 110. The second input terminal is configured to receive the reset signal SRST. The gating circuit 140 is configured to output a gating enable signal SGEn according to the output data Q[p] and the clock signal SCLK. In some embodiments, the gating enable signal SGEn is also coupled to the reset terminal of the second FF 120 and configured to reset the second FF 120. The operation of the gating circuit 140 would be described later.

The clock gating circuit 150 includes a first input terminal coupled to the clock signal SCLK, a second input terminal coupled to the output terminal of the gating circuit 140 for receiving the gating enable signal SGEn, and an output terminal is coupled to the clock terminal CLK2 of the second FF 120. In the embodiments, the clock gating circuit 150 is configured to disable the second FF 120 by clock gating technique. In other words, the output data of the first FF 110 may trigger a condition for disabling the operation of the second FF 120 by decoupling the second FF 120 from the clock signal through the gating circuit 140. In some embodiments, the clock gating circuit 150 includes a NOR gate (not shown). The NOR gate is configured to receive the clock signal SCLK at a first input terminal and the gating enable signal SGEn at a second input terminal. According to the gating enable signal SGEn, the NOR gate outputs the clock gating signal SCG. That is, the clock signal received at the first input terminal may be blocked according to the gating enable signal SGEn received at the second input terminal. In some other embodiments, the clock gating circuit 150 may further includes a logic inverter (not shown) coupled at the output terminal of the NOR gate according to the designed requirement.

In an embodiment where the second FF 120 is synchronous with a signal received at the clock terminal of the second FF 120, the second FF 120 is clock gated based on a clock gating signal SCG generated by the clock gating circuit 150. The clock terminal of the second FF 120 is coupled to the output terminal of the clock gating circuit 150 to receive the clock gating signal SGC. Based on the gating enable signal SGEn output by the gating circuit 140, the clock gating circuit 150 couples either the clock signal SCLK or the clock gating signal SCG to the clock terminal of the clock terminal CLK2 of the second FF 120. In the clocking gating technique of the embodiment, the clock gating signal SCG does not transition between states. The state of the second FF 120 would not be changed regardless of the input data received at the input terminal D2, since the clock gating signal SCG does not transition between states in response to the gating enable signal generated based on the output data of the first FF 110. As a result, the energy may be conserved since the second FF 120 used for upper bits is disabled through the clock gating technique.

The power gating circuit 160 includes a first terminal coupled to the supply voltage Vs, a second terminal coupled to the power terminal PW2 of the second FF 120, and a control terminal coupled to the output of the gating circuit 140 for receiving the gating enable signal SGEn. The power gating circuit 160 is coupled between the supply voltage Vs and the second FF 120 and configured to couple or decouple the supply voltage Vs to or from the second FF 120 according to the gating enable signal SGEn output by the gating circuit 140. In other words, the output data of the first FF 110 may trigger a condition for disabling the operation of the second FF 120 through the power gating circuit 160. In the embodiments, the power gating circuit 160 is configured to disable the second FF 120 by decoupling the second FF 120 from the supply voltage Vs, which may be referred to as power gating technique. As a result, the energy may be conserved since the second FF 120 used for upper bit(s) is disabled through the clock gating technique. The power gating circuit 160 may include a p-type transistor as illustrated in FIG. 1. However, the disclosure is not intended to limited thereto. In other embodiments, other type of switch, n-type transistor, or any other type of logic circuit having a switching function may be used for implementing the power gating circuit 160.

In the embodiments, the shift register 100 may be N-bit shift registers configured to handle N bits of input data. FIG. 1 is simplified for the purpose of illustration. It should be noted that the first FF 110 includes a plurality of first FFs 110. Each of first FFs 110 is configured to handle one bit of input data within the first portion of the input data Din[0:p], respectively. The second FF 120 includes a plurality of second FFs 120. Each of the second FFs 120 is configured to handle one bit of input data within the second portion of the input data Din [(p+1):(N−1)], respectively. The total number of the FFs in the first and second FFs 110, 120 would be N or greater according to design requirement.

Figure 2:
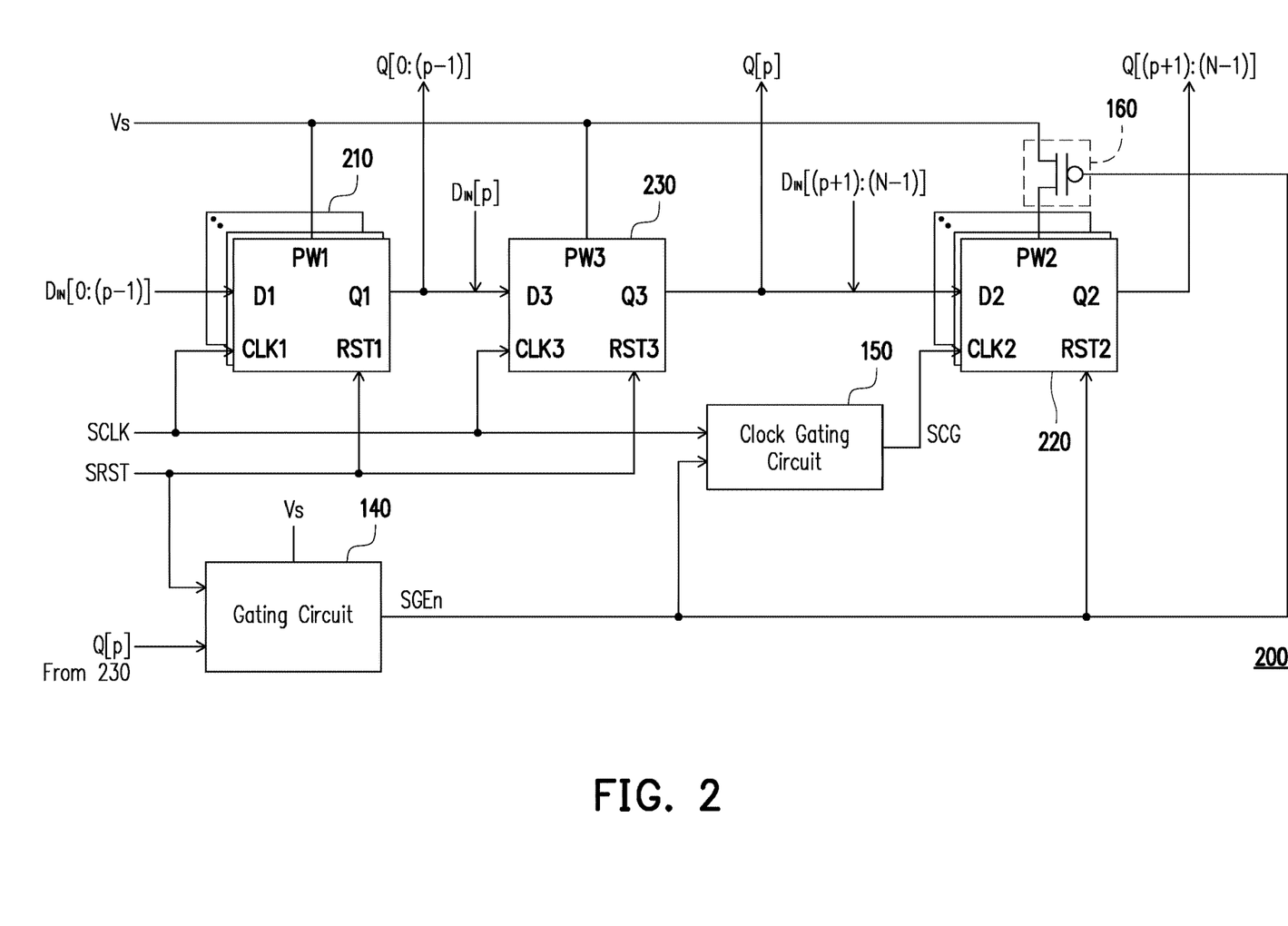
FIG. 2 is a diagram illustrating a shift register according to some embodiments of the disclosure.

FIG. 2 is a diagram illustrating a shift register 200 according to some embodiments of the disclosure. The shift register 200 includes a first FF 210, a second FF 220, a third FF 230, a gating circuit 240, a clock gating circuit 150, and a power gating circuit 160. The first FF 210, the third FF 230, and the second FF 220 are daisy chained together in series and respectively receive different portions of the input data Din. In the embodiments, the shift register 200 receives N bits of input data Din[0:(N−1)]. The first FF 210 includes a plurality of first FFs 210 that respectively receive a first portion of the input data, Din[0:(p−1)]. The second FF 220 includes a plurality of second FFs 220 that respectively receives a second portion of the input data Din[(p+1):(N−1)]. The third FF 230 is coupled between the first and second FFs 210, 220 and configured to receive a third portion of the input data Din[p]. In the embodiment, the variable p may be any integer greater than 1 and less than N−2. In other words, the third portion of the input data Din[p] has a bit position that is between the first and second portion of the input data. In the embodiments, the input data Din and output data Q of the first FFs are described collectively as the first FF 210 unless specified. Similarly, the input data Din and output data Q of the second FFs are described collectively as the second FF 220 unless specified.

The first FF 210 includes an input terminal D1, a clock terminal CLK1, a reset terminal RST1, an output terminal Q1, and a power terminal PW1. The input terminal D1 is coupled to the first portion of the input data Din[0:(p−1)]. The clock terminal CLK1 is coupled to a clock signal SCLK. The reset terminal RST1 is coupled to a reset signal SRST. The power terminal PW1 is coupled to a supply voltage Vs. The output terminal Q1 is coupled to the third FF 230 and outputs an output data of the first FF (e.g., Q[0:p]). The functionality of the first FF 210 is similar to the first FF 110 as illustrated in the embodiments of FIG. 1, and thus the detail description would be omitted here for brevity.

The third FF 230 includes an input terminal D3, a clock terminal CLK3, a reset terminal RST3, an output terminal Q3, and a power terminal PW3. The clock terminal CLK3 is coupled to the clock signal SCLK. The reset terminal RST3 is coupled to the reset signal SRST. The power terminal PW3 is coupled to the supply voltage Vs. The input terminal D3 is coupled to the p-th bit of the input data Din[p] and the output terminal of the first FF 210 (e.g., output terminal of the (p−1)th first FF 210[(p−1)]). The output terminal Q3 is coupled to the subsequent second FF 220 and outputs an output data Q[p]. Similar to the first FF 210, the third FF 230 is configured to transition between two different states based on the input data Din[p], the clock signal SCLK, and the reset signal SRST. In the embodiments, the output terminal Q3 of the third FF 230 is also coupled to an input terminal of the gating circuit 140, which would be described in detail later.

The second FF 220 includes an input terminal D2, a clock terminal CLK2, a reset terminal RST2, an output terminal Q2, and a power terminal PW2. The input terminal D2 is coupled to the second portion of the input data Din[(p+1):(N−1)]. The clock terminal CLK2 is coupled to the clock signal SCLK. The reset terminal RST2 is coupled to the reset signal SRST. The power terminal PW2 is coupled to the supply voltage Vs. The output terminal Q2 outputs an output data Q[(p+1):(N−1)]. The functionality of the first FF 210 is similar to the second FF 120 as illustrated in the embodiments of FIG. 1, and thus the detail description would be omitted here for brevity.

In the embodiments, the output data Q[p] corresponding to the p-th bit Din[p] of the input data is coupled to the third FF 230. The output data Q[p] may be referred to as a threshold bit which may be used as a criterion for disabling the second FF 220. The output data Q[p] generated by the third FF 230 is also coupled to the gating circuit 140. The gating circuit 140 determines whether to disable the second FF 220 based on the output data Q[p] corresponding to the third portion of the input data Din[p]. The state of the output data Q[p] output by the third FF 110 may reflect that the number of bits that would be involved in a computation to be performed to a batch of input data. The batch of input data refers to a plurality of input data to be processed in a sequence. For example, the output data bit Q[p] of the third FF 230 is output based on initial input data of a batch of data to be processed. Therefore, the width of input data within batch of input data to be processed may be assumed to be the same until the process designated for the batch is completed. Example of the process may be image recognition in the image processing or any process that processes massive amount of data with shift register. For example, each of the images may be divided into many different regions in pixels for convolution computation.

In the embodiments, the shift register may be a 20-bit shift register (i.e., N=20), and the variable p may be 11 which signifies $12^{th}$ bit (i.e., bit 11) of the input data Din. In other words, the second FF 220 may be disabled based on the bit 11 of the input data Din[11] which may be reflected by the output data Q[11] of the third FF 230. The bit 11 is used as a threshold bit for determining whether the computation of the batch of input data would exceeds 12 bits or not. If not, the FFs corresponding to the upper bits (bit 12-19) of the input data Din may be safely disabled. The gate circuit 140 disables the second FF 220 that handle the upper bits of the input data Din [11:19]. For example, the gating circuit 140 may detect toggling of the output data Q[11] (an example of Q[p]) from the third FF 230. The toggling of the output data Q[11] indicates that the third FF 230 of the shift register 230 is being used for computation, and therefore, the second FF 220 for handling the second portion of the input data Din[(p+1):(N−1)] may not be safely disabled. On other hand, if the output data Q[p] from the third FF 230 does not toggle, the second FF 220 for handling the second portion of the input data Din[(p+1):(N−1)] may be safely disabled to conserve energy. That is, the shift register 200 may enter a low power mode by disabling the second FF 220.

In detail, the gating circuit 140 generates the gating enable signal SGEn which is coupled to the clock gating circuit 150 and the power gating circuit 160. Based on the gating enable signal SGEn, the clock gating circuit 150 may gate the clock signal SCLK from the clock terminal CLK2 of the second FF 220 as to disable the second FF 220. Furthermore, the power gating circuit 160 may gate the supply voltage Vs from the power terminal PW2 of the second FF 220 as to disable the second FF 220. In the disclosure, the second FF 220 may be disabled through either the clock gating circuit 150, the power gating circuit 160, or both.

Figure 3:
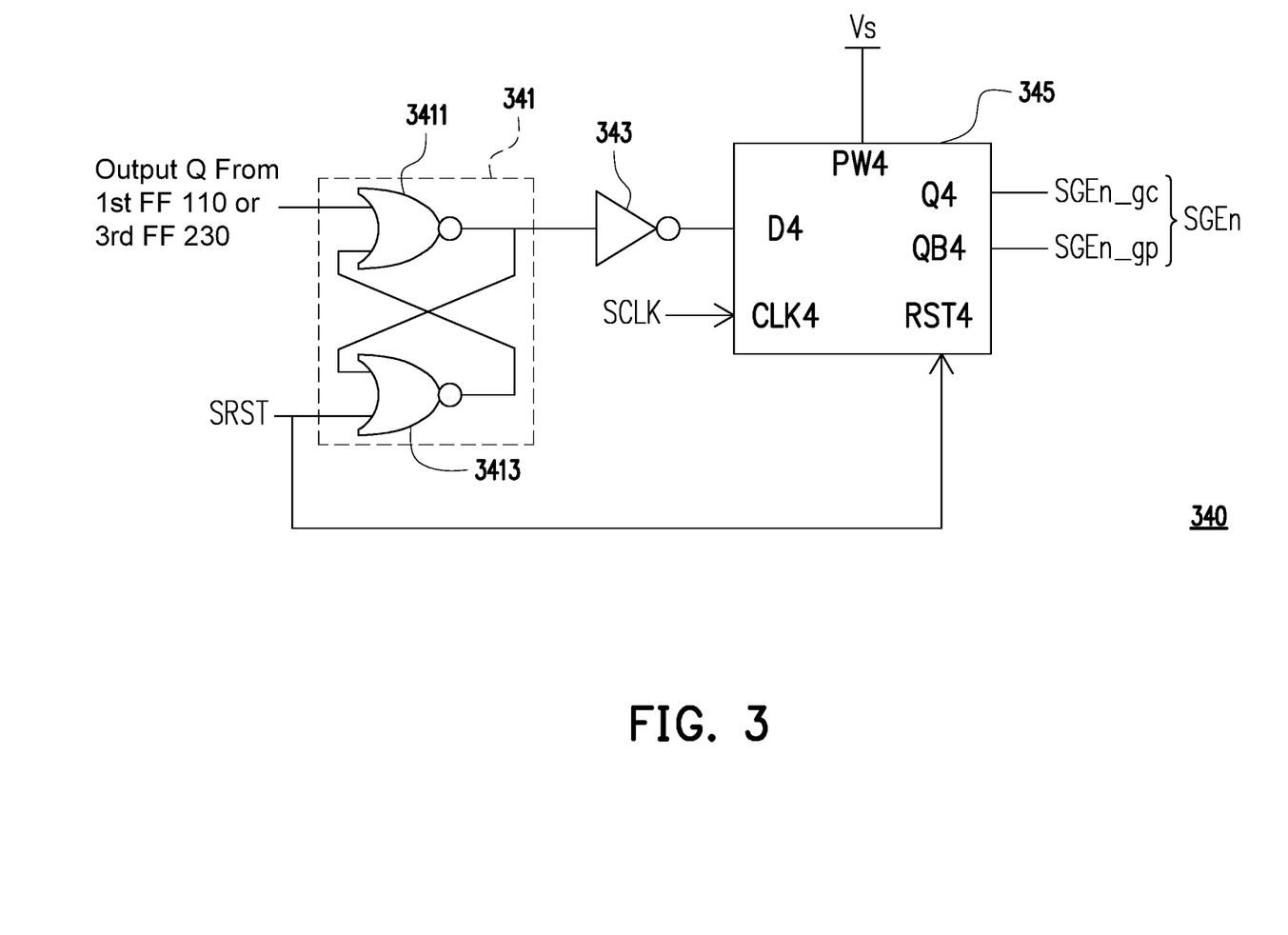
FIG. 3 is a diagram illustrating a gating circuit according to some embodiments of the disclosure.

FIG. 3 is a circuit diagram illustrating a gating circuit 340 according to some embodiments of the disclosure. The gating circuit 140 as illustrated in FIGS. 1 and 2 may be implemented by the gating circuit 340. With reference to FIG. 3, the gating circuit 340 includes a latch 341, a logic inverter 343, and a FF 345 (may also referred to as a gating FF). In the embodiments, the latch 341 includes two cross-coupled NOR gates 3411, 3413. Input terminal of one of the cross-coupled NOR gate 3411 is coupled to the output terminal of the third FF 230 in FIG. 2 or the output terminal of the first FF 110. Input terminal of another one of the cross-coupled NOR gate 3413 is coupled to the reset signal SRST. The output terminal of the latch 341 is configured to change states based on the output data Q[p] and the reset signal SRST.

The FF 345 includes an input terminal D4, a clock terminal CLK4, a reset terminal RST4, a power terminal PW4, a first output terminal Q4, and a second output terminal Q4b. The input terminal D4 is coupled to the output terminal of the latch 341. The clock terminal CLK4 is coupled to the clock signal SCLK. The reset terminal RST4 is coupled to the reset signal SRST. The power terminal PW4 is coupled to a supply voltage Vs. The first output terminal Q4 is configured to output a signal according to the input received at the input terminal D4, which may be referred to as a clock gating signal SGEn_gc. Signal output from the second output terminal Q4b is complementary of the signal output from the first output terminal Q4b, which may be referred to as a power gating signal SGEn_gp. In the embodiments, the clock gating signal SGEn_gc is coupled to the clock gating circuit 150 and the reset terminal RST2 of the second FF 220. The power gating signal SGEn_gp is coupled to the power gating circuit 160. In some other embodiments, the power gating signal SGEn_gp may be generated by a logic inverter (not shown) by using the clock gating enable signal SGEn_gc, since the power gating signal SGEn_gp and the clock gating enable signal SGEn_gc are complementary signals. In the disclosure, the clock gating enable signal SGEn_gc and the power gating enable signal SGEn_gp are collectively described as the gating enable signal SGEn for the purpose of brevity. It should be comprehensive to those skilled in the art that the gating enable signal are used to toggle the operation(s) of the clock gating circuit 150 and/or the power gating circuit 160. In the embodiments, the inverter 343 is coupled between the output of the latch 341 and the input terminal D4 of the FF 345.

Figure 4:
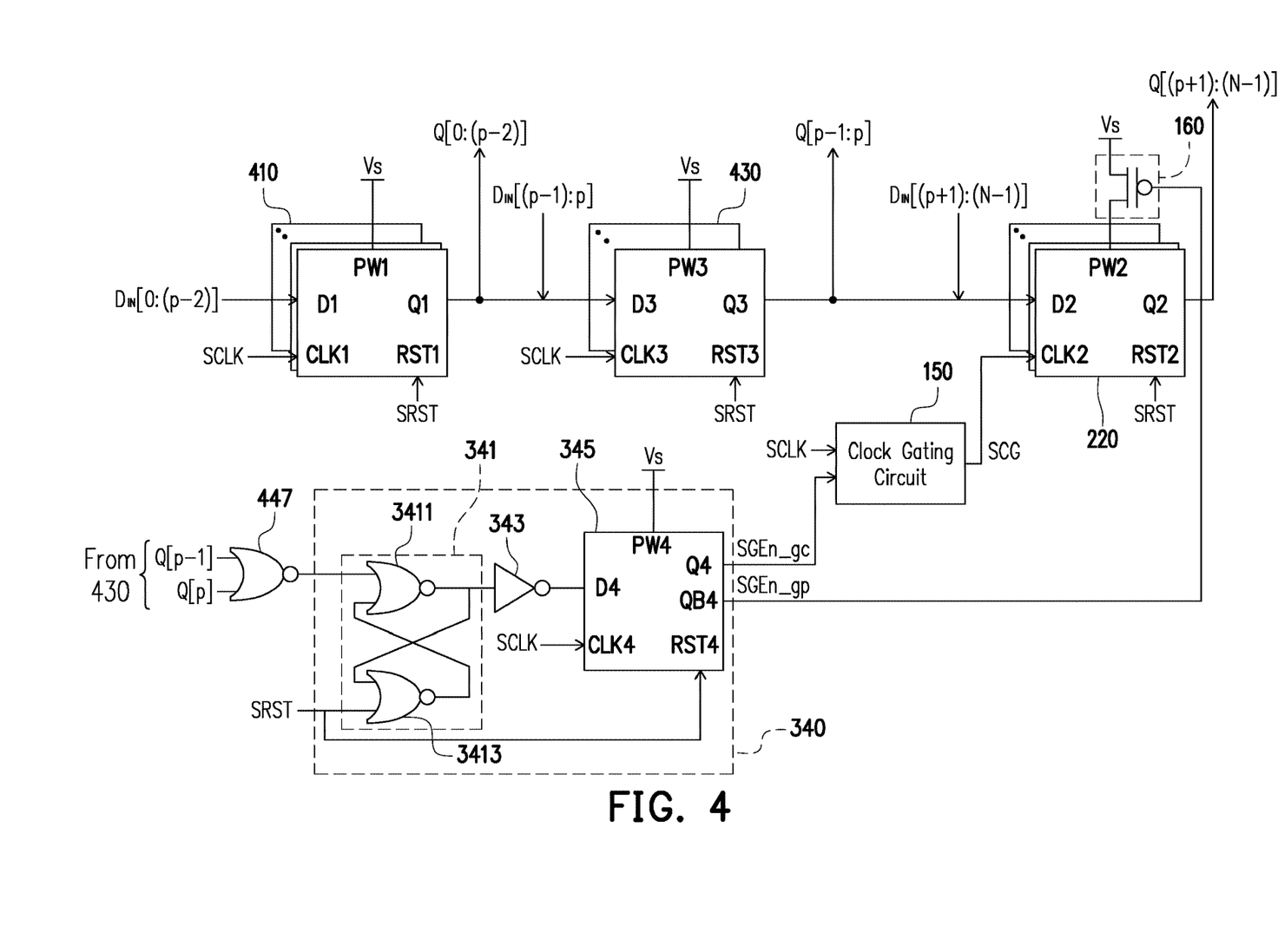
FIG. 4 is a diagram illustrating a shift register according to some embodiments of the disclosure.

FIG. 4 is a diagram illustrating a shift register 400 according to some embodiments of the disclosure. Similar to the shift register 200 illustrated in FIG. 2, the shift register 400 includes a first FF 410, the second FF 220, a third FF 430, a gating circuit 240, a clock gating circuit 150, and a power gating circuit 160. As compared to the shift registers 200 illustrated in FIG. 2, the third FF 430 includes a plurality of FFs and a first portion of the input data is bit 0 thru bit (p−2) (i.e., Din[0:(p−2)]. The operations of other components in the shift register 400 are similar to the shift register 200 as described above unless specified. Instead of depending on one bit of the input data Din (e.g., Din[p]), the shift register 400 disables the second FFs 220 based on a plurality of bits in the input data Din. In the embodiments, the first FF 410 is configured to receive and handle the first portion of the input data Din[0:(p−2)], and the third FF 430 is configured to receive and handle a third portion of the input data Din[(p−1):p]. However, the embodiment is not limited thereto. In other embodiments, the third register 430 may be configured to receive and handle more than two bits in the input data Din.

With reference to FIG. 4, the gating circuit 340 is further coupled to a NOR gate 447 at the first terminal. The NOR gate 447 is configured to receive the output data Q[(p−1)], Q[p] from the third FF 430 and transition between states accordingly. Output terminal of the NOR gate 447 is coupled to the first terminal of the latch 341. The gating circuit 340 generates the gating enable signal SGEn according to the input data Din[(p−1):p] which is reflected by the output data Q[(p−1):p] from the third FFs 430. The embodiments are not intended to limit the number of bits that are utilized for determining whether to disable the second FF 220. In some other embodiments, the disablement of the second FF 220 may be based on 3 or more bits in the input data Din.

In the embodiments described above, the disablement of the second FF 220 is based on the third portion of the input data Din, where the third portion of the input data Din is between the first and second portion of the input data. The output data of the third FF is coupled to the gating circuit for activating the disablement of the second FF 220. In some other embodiments, the third portion of the input data Din may be any bit positions in the input data, and the bit positions does not have to be subsequent to each other. For example, in an example of 20-bit input data Din[0:19], the third portion of the input data may be bit 4 Din[4], bit 10 Din[10], bit 15 Din[15], etc. In such embodiments, the shift register would include a plurality of third FFs respectively within a plurality of FFs arranged in a sequence. That is, the FF for handling the input data Din[4], the FF for handling the input data Din[10], and the FF for handling the input data Din[15] may be configured as the third FF as described in the embodiments illustrated in FIGS. 2 and 4, which are respectively coupled to the gating circuit. In some embodiments, any one of these input data Din[4], Din[10], Din[15] may trigger a low power mode by disabling the subsequent FFs in the shift register. For example, if Din[4] triggers the low power mode, the gating circuit may be configured to disable all of the FFs (i.e., second FF) subsequent to the FF (i.e., third FF) that receives the input data Din[4]. If Din[10] triggers the low power mode, the gating circuit may be configured to disable all of the FFs (i.e., second FF) subsequent to the FF (i.e., third FF) that receives the input data Din[10]. If Din[15] triggers the low power mode, the gating circuit may be configured to disable all of the FFs (i.e., second FF) subsequent to the FF (i.e., third FF) that receives the input data Din[15]. As such, the shift register may disable different number of the FFs according to the computation required by the input data. In some embodiments, the gating circuit and the clock gating circuit may each further include a selection circuit that outputs the gating enable signal SGEn for selectively disable different number of second FFs based on the input data Din[5], Din[10], Din[15].

Figure 5:
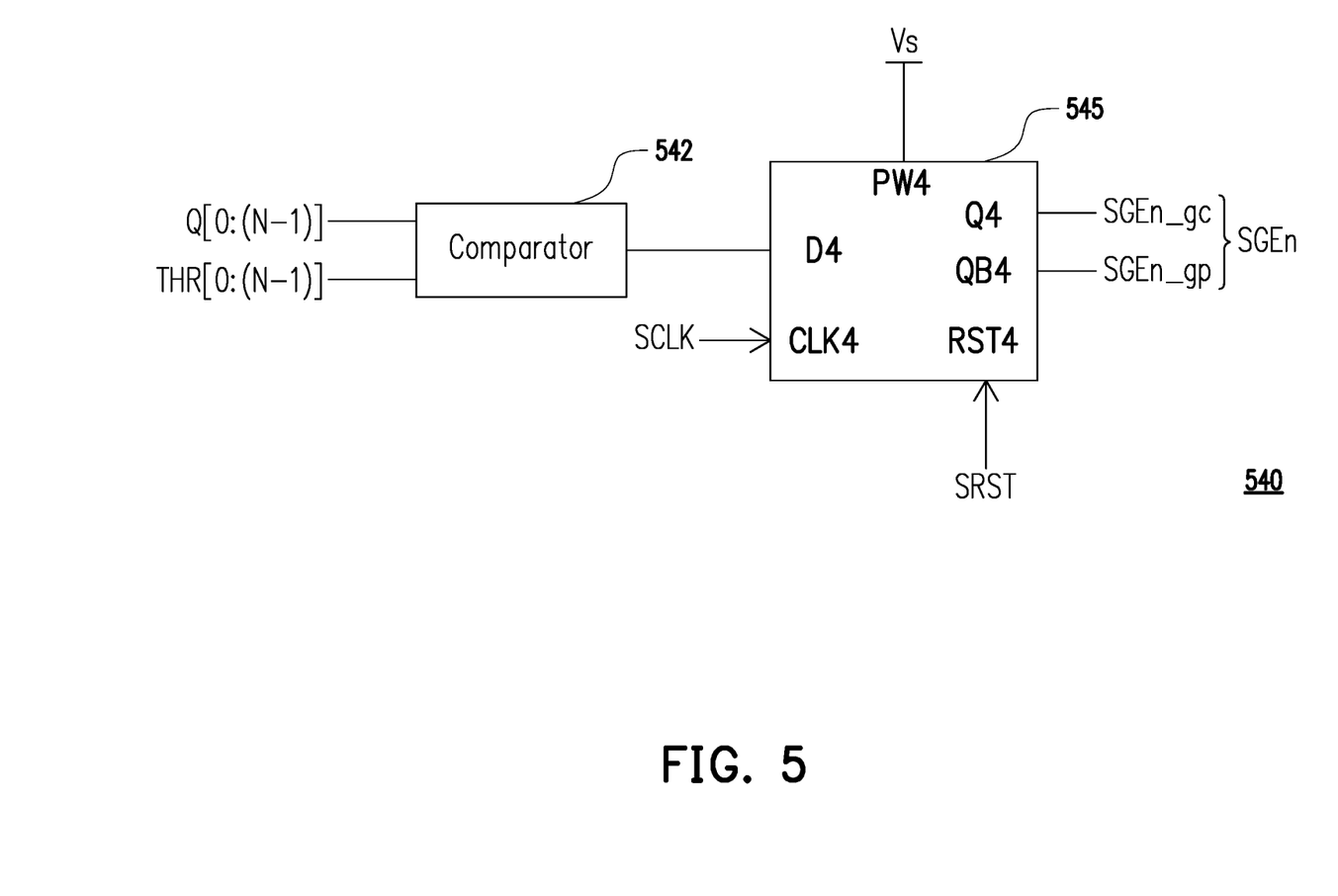
FIG. 5 is a diagram illustrating a gating circuit according to some embodiments of the disclosure.

FIG. 5 is a diagram illustrating a gating circuit 540 according to some embodiments of the disclosure. The gating circuit 540 includes a comparator 542 and an FF 545. In the embodiments, the FF 545 has similar function and structure as the gating FF 345 illustrated in FIG. 3. The comparator 542 is coupled to the output data Q[0:(N−1)] of the shift register and configured to compare the output data Q[0:(N−1)] to a predetermined threshold THR[0:(N−1)]. The output data Q[0:(N−1)] is the existing data stored in the shift register, and the threshold THR[0:(N−1)] may be predefined according to the design requirements. The comparator 542 outputs a comparison result to the FF 545, where the FF 545 generates and output the gating enable signal SGEn according to the comparison result. For example, if the comparison result indicates that the output data Q[0:(N−1)] is less than the predetermined threshold THR[0:(N−1)], the comparator generates a logic low output, which indicates that the FFs (i.e., second FF) handling the upper bits of the input data Din may be safely disabled. At the rising edge of the clock signal, the FF 545 would output the gating enable signal SGEn as to enable the clock gating circuit to gate the clock signal and/or the power gating circuit to gate the supply voltage.

Figure 6:
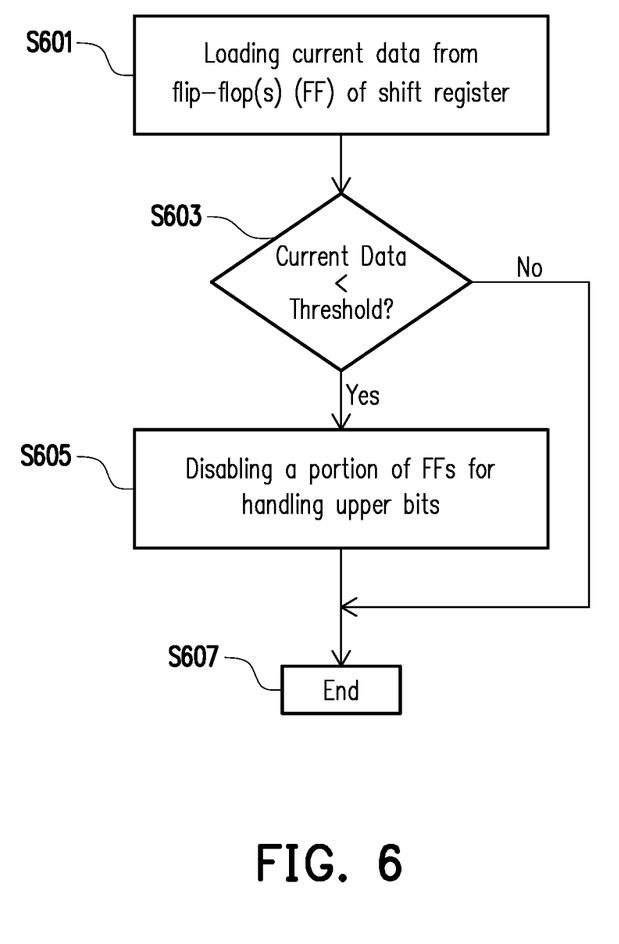
FIG. 6 is a flow diagram illustrating a method for a shift register to enter a low power mode according to some embodiments of the disclosure.

FIG. 6 is a flow diagram illustrating a method for a shift register to enter a low power mode according to some embodiments of the disclosure. The method may be implemented by any of the embodiments as described above. In step S601, current data stored in the shift register is loaded. The current data is referred to as the output data of FF(s). For example, the current data may be the output data Q[p] in the embodiments of FIGS. 1 and 2, the output data Q[(p−1):p] in the embodiments of FIG. 4, or the output data Q[0:(N−1)] in the embodiments of FIG. 5. In step S603, the current data is compared to a predetermined threshold. If the current data is less than the predetermined threshold, the process goes to step S605 (i.e., "Yes" path). Otherwise, the process goes to "end" S607 and skips the step S605. In the step S603, the comparison may be comparison between one or more bits of the current data being stored in the shift register. If the step S603 is true, the shift register enters a low power mode by disabling a portion of the FFs that handles the upper bits of the input data. The disabling of the portion of the FFs may be performed by gating the clock signal and/or gating the supply power. Accordingly, the portion of FF would be disabled for the subsequent cycles and energy is conserved.

In accordance with some embodiments of the disclosure, a shift register includes a first flip-flop (FF), a second FF, and a gating circuit. The first FF is configured to receive a first portion of input data. The second FF is coupled to the first FF in series and configured to receive a second portion of input data. The gating circuit is configured to disable the second FF for storing the second portion of the entire input data according to output data currently being stored in the first FF during at least one writing cycle where the entire input data is being written to the shift register.

In accordance with some embodiments of the disclosure, a shift register includes a first FF, a second FF, a third FF, and a gating circuit. In the embodiments, the first FF, receives a first portion of input data. The second FF receives a second portion of input data. The third FF is coupled between the first and second FFs, and configured to receive a third portion of the input data, wherein the third portion of the input data is between the first and second portions of the input data. The gating circuit disables the second FF for storing the second portion of the entire input data according to output data currently being stored in the third FF while storing the first portion of the subsequent input data to the first FF during at least one writing cycle of the shift register.

In accordance with some embodiments of the disclosure, a method for disabling flip-flop(s) (FF) in a shift register is provided. The method includes at least the following steps: loading current data stored in a first FF included in a shift register; and disabling a second FF in the shift register for handling the second bit of the input data according to the current data stored in the first FF while writing the first bit of the input data to the first FF during at least one entire data writing cycle of the shift register.

The embodiments of the disclosure may include any one or more of the novel features described above, including in the Detailed Description, and/or shown in the drawings. As used herein, "at least one", "one or more", "and/or", and "coupled to" (or "couple to" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more" and "at least one" can be used interchangeably herein. In addition, the expressions "A is coupled to B" or "A couple to B" may be referred to as A is directly or indirectly coupled to or connected to B.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A shift register, comprising:
   a first flip-flop (FF), configured to receive a first portion of input data;
   a second FF, coupled to the first FF in series and configured to receive a second portion of input data; and
   a gating circuit, configured to disable the second FF for storing the second portion of the entire input data according to output data currently being stored in the first FF during at least one writing cycle where the entire input data is being written to the shift register.

2. The shift register of claim 1, wherein the gating circuit comprises:
   a gating FF, including an input terminal coupled to an output terminal of the first FF and an output terminal coupled to the second FF.

3. The shift register of claim 2, wherein the gating circuit further comprises:
   a latch, including a first input terminal coupled to the output terminal of the first FF, second input terminal coupled to a reset signal, and an output terminal coupled to the input terminal of the gating FF.

4. The shift register of claim 2, wherein the gating circuit further comprises:
   a comparator, including a first input terminal coupled to the input data, a second input terminal coupled to a predetermined threshold, and an output terminal, and configured to compare input data to the predetermined threshold, and output a comparison result at the output terminal coupled the gating FF.

5. The shift register of claim 2, further comprising an NOR gate coupled between the first FF and the gating circuit, wherein input terminals of NOR gate is coupled to at least two of the first FFs.

6. The shift register of claim 1, further comprising:
   a power gating circuit, including a first terminal coupled to a supply voltage, a second terminal coupled to a power terminal of the second FF, and a control terminal coupled to the gating circuit.

7. The shift register of claim 1, further comprising:
   a clock gating circuit, including a first input terminal coupled to a clock signal, a second input terminal coupled to the gating circuit, and an output terminal coupled to a clock terminal of the second FF, and configured to gate the clock signal from the second FF based on a gating enable signal output by the gating circuit.

8. The shift register of claim 1, wherein the first FF includes a plurality of first FFs for storing the first portion of the input data, and only the last first FF is coupled to be the gating circuit.

9. The shift register of claim 8, wherein the second FF includes a plurality of second FFs for storing the second portion of the input data.

10. A shift register, comprising:
    a first flip-flop (FF), receiving a first portion of input data;
    a second FF, receiving a second portion of input data;
    a third FF, coupled between the first and second FFs, and receiving a third portion of the input data, wherein the third portion of the input data is between the first and second portions of the input data; and
    a gating circuit, disabling the second FF for storing the second portion of the entire input data according to output data currently being stored in the third FF while storing the first portion of the subsequent input data to the first FF during at least one writing cycle of the shift register.

11. The shift register of claim 10, wherein the third FF includes a plurality of third FFs.

12. The shift register of claim 11, further includes an NOR gate coupled between the plurality of third FFs and an input terminal of the gating circuit.

13. The shift register of claim 10, wherein the gating circuit comprises:
    a gating FF, including an input terminal coupled to an output terminal of the first FF and an output terminal coupled to the second FF.

14. The shift register of claim 13, wherein the gating circuit further comprises:
a latch, including a first input terminal coupled to an output terminal of the first FF, second input terminal coupled to a reset signal, and an output terminal coupled to an input terminal of the gating FF.

15. The shift register of claim 10, further comprising:
a power gating circuit, including a first terminal coupled to a supply voltage, a second terminal coupled to a power terminal of the second FF, and a control terminal coupled to the gating circuit.

16. The shift register of claim 10, further comprising:
a clock gating circuit, including a first input terminal coupled to a clock signal, a second input terminal coupled to the gating circuit, and an output terminal coupled to a clock terminal of the second FF, and configured to gate the clock signal from the second FF based on a gating enable signal output by the gating circuit.

17. A method for disabling flip-flop(s) (FF) in a shift register which is configured to handle an input data including a first bit and a second bit, comprising:
loading current data stored in a first FF included in a shift register; and
disabling a second FF in the shift register for handling the second bit of the input data according to the current data stored in the first FF while writing the first bit of the input data to the first FF during at least one entire data writing cycle of the shift register.

18. The method of claim 17, wherein the second FF is subsequent to the first FF for handling the second bit subsequent to the first bit of input data handled by the first FF.

19. The method of claim 17, wherein the disabling the second FF in the shift register comprises disabling the second FF in the shift register by gating a clock signal coupled to the second FF.

20. The method of claim 17, wherein the disabling the second FF in the shift register comprises disabling the second FF in the shift register by blocking supply voltage provided to the second FF.

* * * * *